(12) United States Patent
Fukumaki et al.

(10) Patent No.: US 8,440,521 B2
(45) Date of Patent: May 14, 2013

(54) METHOD OF MANUFACTURING A SEMICONDUCTOR DEVICE

(75) Inventors: Naomi Fukumaki, Kanagawa (JP); Eiji Hasegawa, Kanagawa (JP); Toshihiro Iizuka, Kanagawa (JP); Ichiro Yamamoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 32 days.

(21) Appl. No.: 13/067,788

(22) Filed: Jun. 27, 2011

(65) Prior Publication Data

US 2012/0028455 A1    Feb. 2, 2012

(30) Foreign Application Priority Data

Jul. 30, 2010    (JP) .................................. 2010-172900

(51) Int. Cl.
    *H01L 21/3105*    (2006.01)

(52) U.S. Cl.
    USPC ..... 438/216; 438/591; 438/783; 257/E21.639

(58) Field of Classification Search .................. 438/216, 438/591, 783, FOR. 187; 257/E21.639
See application file for complete search history.

(56) References Cited

U.S. PATENT DOCUMENTS

| 2008/0096383 | A1 | 4/2008 | Tigelaar et al. | |
| 2009/0134466 | A1 | 5/2009 | Cho et al. | |
| 2010/0038729 | A1* | 2/2010 | Eimori et al. | 257/411 |
| 2011/0175167 | A1* | 7/2011 | Watanabe et al. | 257/368 |
| 2011/0215413 | A1* | 9/2011 | Ikeno | 257/369 |
| 2012/0129330 | A1* | 5/2012 | Kim et al. | 438/591 |

FOREIGN PATENT DOCUMENTS

| JP | 2008-166713 A | 7/2008 |
| JP | 2009-111380 A | 5/2009 |

* cited by examiner

*Primary Examiner* — George Fourson, III
(74) *Attorney, Agent, or Firm* — McGinn IP Law Group, PLLC

(57) ABSTRACT

A method of manufacturing a semiconductor device having a p-type field effect transistor and an n-type field effect transistor includes the steps of: forming an interface insulating layer and a high-permittivity layer on a substrate in the stated order; forming a pattern of a sacrifice layer on the high-permittivity layer; forming a metal-containing film containing metal elements therein on the high-permittivity layer in a first region where the sacrifice layer is formed and a second region where no sacrifice layer is formed; introducing the metal elements into an interface between the interface insulating layer and the high-permittivity layer in the second region by conducting a heat treatment; and removing the sacrifice layer by wet etching, wherein in the removing step, the sacrifice layer is etched easily more than the high-permittivity layer. With this configuration, the semiconductor device excellent in reliability is obtained.

1 Claim, 9 Drawing Sheets

METHOD OF MANUFACTURING A SEMICONDUCTOR DEVICE

CROSS-REFERENCE TO RELATED APPLICATIONS

The disclosure of Japanese Patent Application No. 2010-172900 filed on Jul. 30, 2010 including the specification, drawings, and abstract is incorporated herein by reference in its entirety.

BACKGROUND

The present invention relates to a method of manufacturing a semiconductor device.

Japanese Unexamined Patent Application Publication No. 2009-111380 discloses a technique by which different work function modulating elements are implanted into the respective gate stacks of a PMOS region and an NMOS region (a gate electrode and a gate insulator film).

According to this publication, a layer containing the work function modulating elements therein is formed over a gate electrode, and the layer in the PMOS region is removed through the photolithography so that only the work function modulation elements in the NMOS region remain. Subsequently, a heat treatment is conducted on the gate stacks so that the work function modulating elements are implanted into the gate stack. As a result, the different work function modulating elements are implanted into the PMOS region and the NMOS region so that the work functions of the respective gate stacks can be controlled.

Japanese Unexamined Patent Application Publication No. 2008-166713 discloses a technique by which a dielectric layer configuring a gate insulator film remains in only one of two regions through the lift-off technique.

SUMMARY

As a result of studying by the inventors, if the photolithography is used, ashing is required for peeling off a resist. However, it is found that when the ashing is conducted, an underlying film such as a gate electrode is damaged by plasma, and transistor characteristics fluctuate.

According to one aspect of the present invention, a method of manufacturing a semiconductor device having a p-type field effect transistor and an n-type field effect transistor, includes the steps of:

forming an interface insulating layer and a high-permittivity layer on a substrate in the stated order;

forming a pattern of a sacrifice layer on the high-permittivity layer;

forming a metal-containing film containing metal elements therein on the high-permittivity layer in a first region where the sacrifice layer is formed and a second region where no sacrifice layer is formed;

introducing the metal elements into an interface between the interface insulating layer and the high-permittivity layer in the second region by conducting a heat treatment; and removing the sacrifice layer by wet etching, and in the removing step, the sacrifice layer is etched more easily than the high-permittivity layer.

According to the aspect of the present invention, the metal elements that modulate the work function are introduced into the interface between the interface insulating layer and the high-permittivity layer in the second region with the use of the pattern of the sacrifice layer. In removing the sacrifice layer, since the removal can be conducted under a condition in which the etching selectivity of the sacrifice layer to the high-permittivity layer of the underlying layer is high, damage on the high-permittivity layer can be reduced as compared with the removing method using ashing. Therefore, the semiconductor device excellent in reliability is obtained.

The present invention provides the manufacturing method for obtaining the semiconductor device excellent in the reliability.

DETAILED DESCRIPTION

Figure 1:
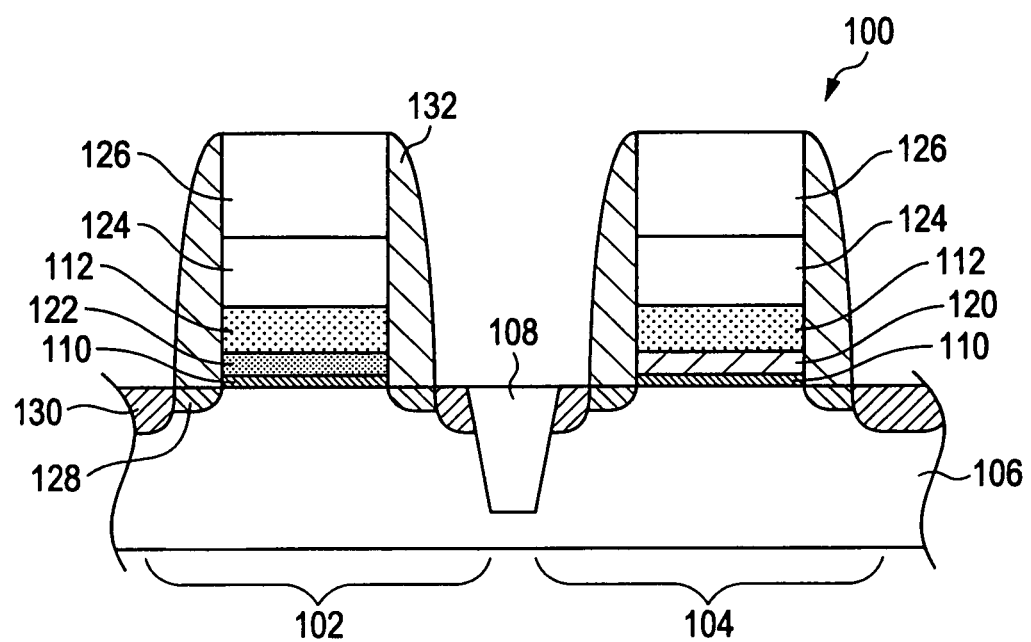
FIG. 1 is a cross-sectional view illustrating a semiconductor device according to an embodiment of the present invention.

Hereinafter, an embodiment of the present invention will be described with reference to the accompanying drawings. In the drawings, the same components are denoted by identical symbols, and their description will be appropriately omitted.

First Embodiment

First, a first embodiment will be described.

FIG. 1 is a cross-sectional view illustrating a configuration of a semiconductor device according to this embodiment.

A semiconductor device 100 according to the first embodiment includes a p-type field effect transistor and an n-type field effect transistor, which are disposed on the same semiconductor substrate 106. In each of a PMOS region 102 and an NMOS region 104 is provided a common structure of a gate insulating film (an interface oxide film 110, a high-permittivity film 112) and a gate electrode (a TiN 124, an amorphous electrode 126). In the PMOS region 102, a work function modulating metal 122 is introduced into an interface between the interface oxide film 110 and the high-permittivity film 112. On the other hand, in the NMOS region 104, a work function modulating metal 120 different in type from the work function modulating metal 122 is introduced into an interface between the interface oxide film 110 and the high-permittivity film 112.

Also, as illustrated in FIG. 1, a source drain extension region 128 and a source drain region 130 are located adjacent to a surface layer of the semiconductor substrate 106 on both walls of each gate electrode. Also, a side wall 132 is disposed on both walls of each gate electrode.

Subsequently, a method of manufacturing the semiconductor device 100 according to the first embodiment will be described. FIGS. 2A, 2B to 4A, 4B are cross-sectional views illustrating a manufacturing procedure for the semiconductor device according to this embodiment.

The method of manufacturing the semiconductor device 100 is a method of manufacturing a semiconductor device having a p-type field effect transistor and an n-type field effect transistor, including the following steps.

A step of forming an interface insulating layer (an interface oxide film 110) and a high-permittivity layer (a high-permittivity film 112) on a substrate in the stated order.

A step of forming a pattern of a sacrifice film 114 on the high-permittivity film 112.

A step of forming a metal-containing film 118 containing metal elements therein on the high-permittivity film 112 in a first region (a PMOS region 102) where the sacrifice film 114 is formed, and a second region (an NMOS region 104) where no sacrifice film 114 is formed.

A step of introducing the metal elements into an interface between the interface insulating film 110 and the high-permittivity film 112 in the second region (the NMOS region 104) by conducting a heat treatment.

A step of removing the sacrifice film 114 by wet etching. In the removing step in the method of manufacturing the semiconductor device 100 according to this embodiment, the sacrifice film 114 is etched easily more than the high-permittivity film 112.

Figure 2A:
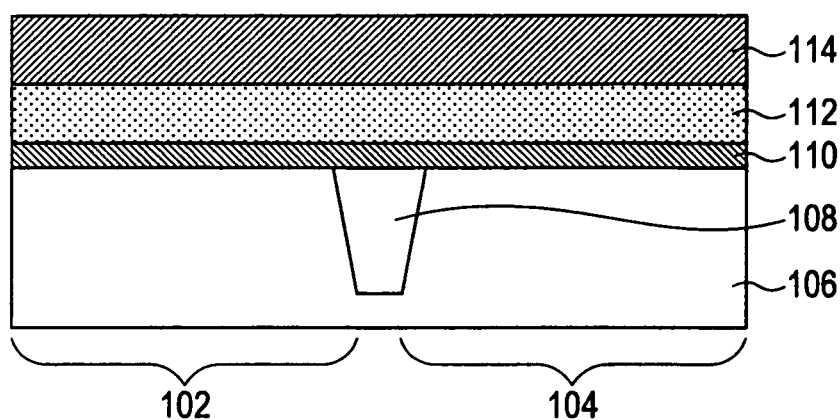
FIGS. 2A and 2B are cross-sectional views illustrating a manufacturing procedure for the semiconductor device according to the embodiment of the present invention.

First, as illustrated in FIG. 2A, an element separation region ($SiO_2$ film) such as an STI (shallow trench isolation) 108 is formed over a main surface of the semiconductor substrate (silicon substrate) 106 through a known method.

Subsequently, the interface oxide film 110 formed by, for example, thermal oxidation, and the high-permittivity film 112 formed by, for example, a metal organic chemical vapor deposition (MOCVD) method, are laminated over the semiconductor substrate 106 in the stated order. In this embodiment, for example, $SiO_2$ or SiON can be used as the interface oxide film 110. Also, for example, HfSiON or $HfO_2$ can be used as the high-permittivity film 112.

Subsequently, the sacrifice film 114 is formed over the high-permittivity film 112 in the PMOS region 102 and the NMOS region 104. The sacrifice film 114 is higher in the etching selectivity than the high-permittivity film 112. The etching selectivity is not particularly limited, preferably 5 or more, and more preferably 10 or more. Also, at least a part of the sacrifice film 114 includes a nitride metal layer containing at least one element selected from a group consisting of titanium, aluminum, a metal element of Group III, and a metal element of Group V. In this embodiment, the sacrifice film 114 is formed of, for example, a TiN film, an AlN film, or a metal nitride film containing an element of Group III or Group V therein.

Figure 2B:
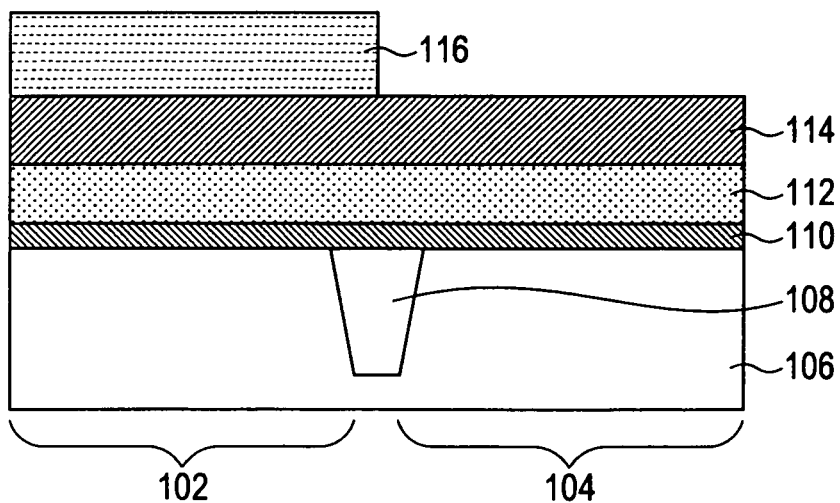

Subsequently, as illustrated in FIG. 2B, a resist pattern 116 is formed over an entire surface of the sacrifice film 114, and the resist pattern 116 is patterned through the photolithography. An opening portion is formed in the resist pattern 116 in the NMOS region 104. A part of the sacrifice film 114 is removed to pattern the sacrifice film 114 with a pattern of the resist pattern 116 as a mask. The pattern of the sacrifice film 114 has an opening portion formed in the NMOS region 104. Then, the resist pattern 116 is peeled off with the use of a medicinal solution containing a general organic acid therein.

Figure 3A:
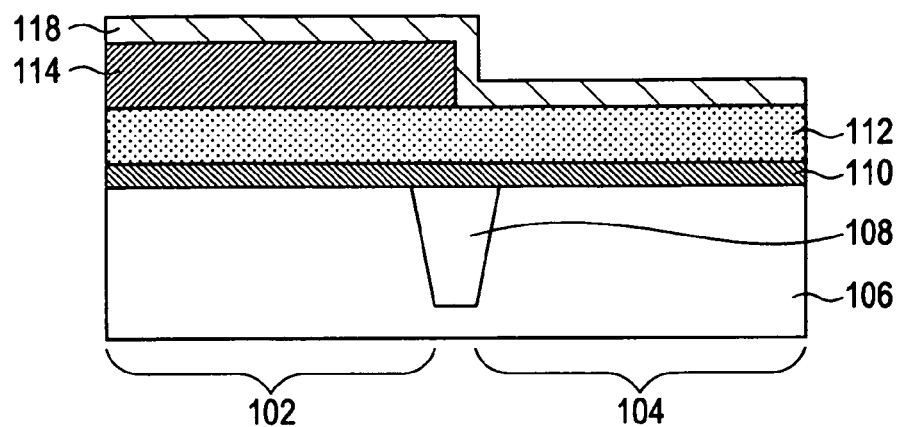
FIGS. 3A and 3B are cross-sectional views illustrating the manufacturing procedure for the semiconductor device according to the embodiment of the present invention.

Subsequently, as illustrated in FIG. 3A, a metal-containing film 118 containing a metal element (hereinafter referred to as "work function modulating metal element") that modulates a work function is formed over an entire surface of the high-permittivity film 112 through, for example, an atomic layer deposition (ALD) method or a physical vapor deposition (PVD) method. The metal-containing film 118 is disposed over the high-permittivity film 112, through the sacrifice film 114 in the PMOS region 102 (first region). On the other hand, the metal-containing film 118 is disposed directly on the high-permittivity film 112. The work function modulating metal element of the metal-containing film 118 is, for example, lanthanoid, yttrium, magnesium, or aluminum. In this embodiment, La is used as the work function modulating element of the metal-containing film 118. The metal-containing film 118 is preferably a metal oxide film although being not particularly limited if the metal-containing film 118 is a film containing the work function modulating metal element therein. The metal-containing film 118 used in this embodiment is $La_2O_3$.

Figure 3B:
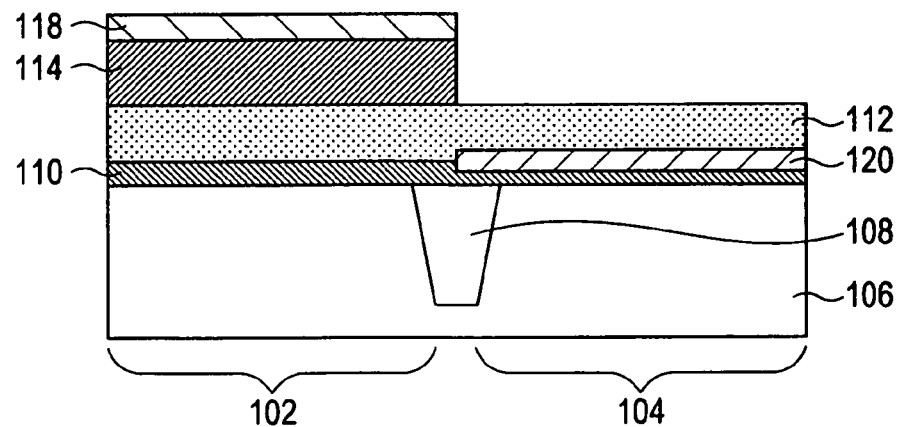

Subsequently, as illustrated in FIG. 3B, in a state where the metal-containing film 118 is disposed directly on the high-permittivity film 112 in the NMOS region 104, a laminated structure is subjected to a heat treatment in a nitrogen atmosphere. In this situation, a concentration of a laminated structure is preferably, for example, 100% although being not particularly limited. As a result, La that is the work function modulating metal element in the metal-containing film 118 can be introduced into the interface between the interface oxide film 110 and the high-permittivity film 112. In this situation, a profile of the work function modulating metal element increases, for example, from the surface layer of the high-permittivity film 112 toward the interface.

In a process of the heat treatment, because the sacrifice film 114 is made of a material containing nitrogen therein, the work function modulating metal element in the metal-containing film 118 is prevented from being diffused into the high-permittivity film 112 through the sacrifice film 114.

As described above, in the heat treatment process of this embodiment, as illustrated in FIG. 3B, La is diffused up to the interface surface between the interface oxide film 110 and the high-permittivity film 112 in a region where the sacrifice film 114 is not formed (the NMOS region 104). On the other hand, in a region that is masked with the sacrifice film 114 (the PMOS region 102), La remains in the sacrifice film 114.

Subsequently, the sacrifice film 114 is removed by wet etching with the use of a medicinal solution such as ammonia hydrogen peroxide mixture, sulfuric acid hydrogen peroxide mixture, or hydrochloric acid hydrogen peroxide mixture. The sacrifice film 114 is high in the selectivity to, for example, HiSiON or $HfO_2$ as the high-permittivity film 112. For that reason, damage on the high-permittivity film 112 can be suppressed when the sacrifice film 114 is subjected to wet etching.

Figure 4A:
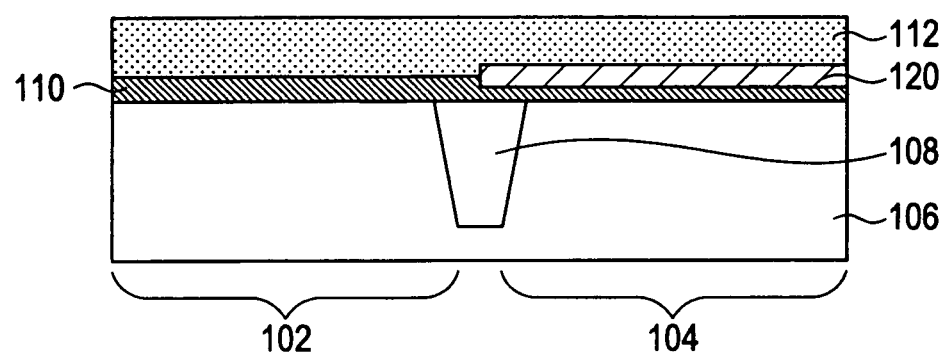
FIGS. 4A and 4B are cross-sectional views illustrating the manufacturing procedure for the semiconductor device according to the embodiment of the present invention.
Figure 4B:
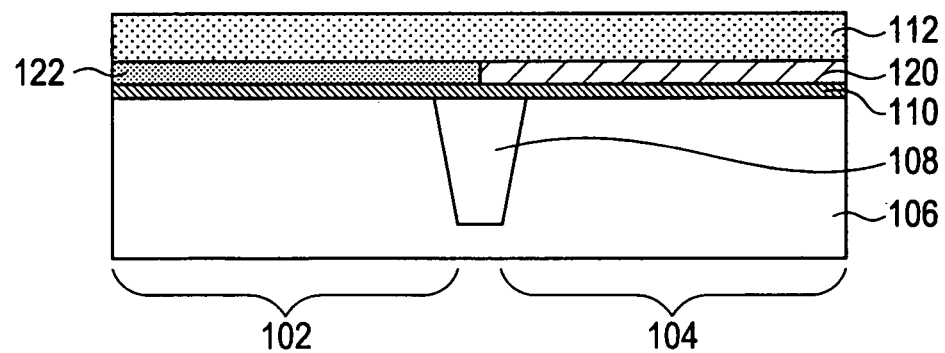

Sequentially, the excessive La (the metal-containing film 118) and the sacrifice film 114 are moved. As a result, a structure is obtained in which La (a work function modulating metal 120) exists in the interface between the interface oxide film 110 and the high-permittivity film 112 in only the NMOS region 104 (FIG. 4A).

Continuously, the same processes as those in FIGS. 2A to 4A are conducted on the PMOS region 102 side. In this situation, Al different from La on the NMOS region 104 side is used as the work function modulating metal element. As a result, as illustrated in FIG. 4B, a structure is obtained in which the work function modulating metal 122 (Al) is introduced into the interface between the interface oxide film 110 and the high-permittivity film 112 in the PMOS region 102. Also, in the structure, the work function modulating metal 120 different in type from the work function modulating metal 122 is introduced into the interface in the NMOS region 104.

Continuously, a normal semiconductor manufacturing process is conducted to form the structure illustrated in FIG. 1. That is, a TiN (titanium nitride) film is formed over the entire surface through a reactive sputtering method of a Ti target of the Ti target. The TiN 124 may be formed through the CVD method or the ALD method instead of the sputtering method. An amorphous Si film is formed over the TiN film. Subsequently, the amorphous Si film and the TiN film are subjected to RIE (reactive ion etching) processing with the use of a hard mask (not shown) to form the TiN 124 and the amorphous electrode 126. Subsequently, B ions are implanted into a p-channel region with the use of a resist not shown, and similarly P or As ions are implanted into an n-channel region with the use of a resist mask. Then, a heat treatment is conducted to form the source drain extension region 128. With the use of the CVD method and the RIE method, the side wall 132 having two layers of a $SiO_2$ film and a silicon nitride film is formed. Thereafter, B ions are implanted into the p-channel region with the use of a resist not shown, and similarly P or As ions are implanted into an n-channel region with the use of a resist mask not shown. Then, a heat treatment is conducted to form the source drain extension region 130. Continuously, a silicide film is formed over surfaces of the source drain region 130 and the amorphous electrode 126 through a known salicide process in a self-aligning manner. As a result, a gate electrode having a laminate structure of FIG. 1 is formed. Thereafter, the semiconductor device 100 according to this embodiment is obtained by conducting formation of an interlayer insulating film, opening and embedding of a contact hole, and formation of wirings as applied to the related-art transistor. In this embodiment, a laminate structure of the TiN 124 and the amorphous electrode 126 is used as the gate electrode. However, the present invention is not limited to this configuration, but various metal gates can be used.

Subsequently, the action and effects of the first embodiment will be described. In the first embodiment, in removing the sacrifice film 114, since the removal can be conducted under a condition in which the etching selectivity of the sacrifice layer 114 to the high-permittivity layer 112 of the underlying layer is high, damage on the high-permittivity layer 112 can be reduced as compared with the method of removing the resist by ashing. Therefore, the semiconductor device 100 that is reduced in the fluctuation of the transistor characteristic and excellent in reliability is obtained.

Also, in the first embodiment, the different work function modulating metals can be introduced into the interface between the interface oxide film 110 and the high-permittivity film 112 in the respective PMOS region 102 and NMOS region 104. As a result, the threshold values of the p-type field effect transistor and the n-type field effect transistor over the same semiconductor substrate can be controlled to respective desired values.

Figure 8A:
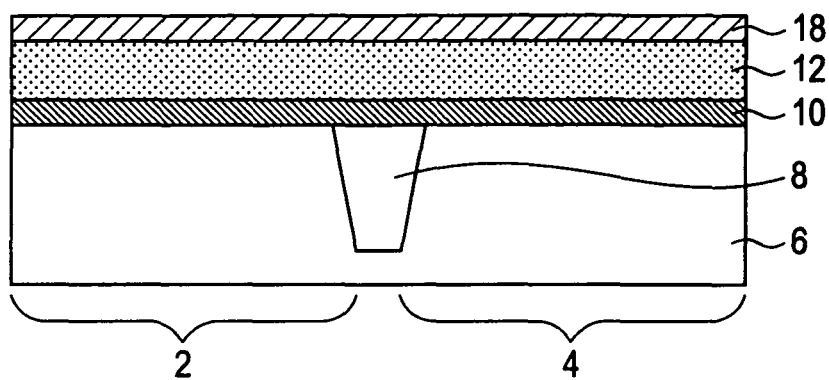
FIGS. 8A and 8B are cross-sectional views illustrating a manufacturing procedure for a semiconductor device according to a comparative example.
Figure 8B:
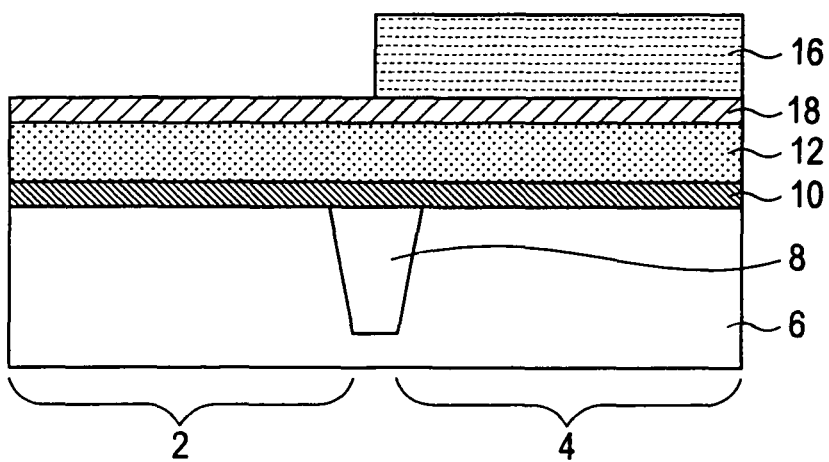
Figure 9:
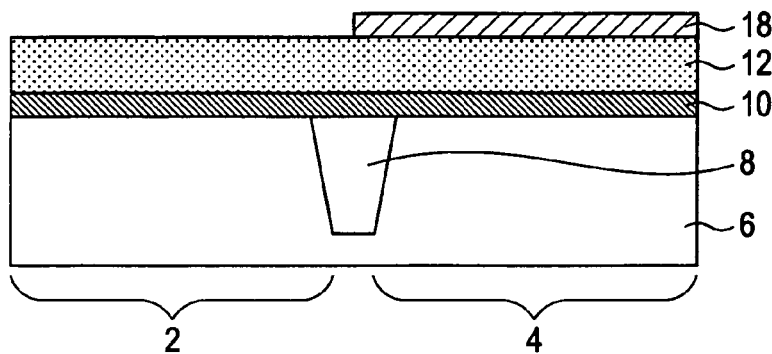
FIG. 9 is a cross-sectional view illustrating a manufacturing procedure for a semiconductor device according to the comparative example.

Subsequently, the advantages of the present invention will be further described with reference to comparative examples illustrated in FIGS. 8 to 10.

In a process of the comparative example, as in Japanese Unexamined Patent Application Publication No. 2009-111380, a metal-containing film 18 containing the work function modulating metal therein is formed over the NMOS region other than a PMOS region 2 with the use of a resist pattern 16. That is, the comparative example is different from this embodiment in that not the sacrifice film 114 but the resist pattern 16 is used.

Subsequently, a flow of the process in the comparative example will be described. As illustrated in FIG. 8A, an interface oxide film 10 and a high-permittivity film 12 are laminated in the stated order on a semiconductor substrate 6 in which a PMOS region 2 and an NMOS region 4 are provided through an STI 8. Subsequently, the metal-containing film 18 ($La_2O_3$) is formed directly on the overall surface of the high-permittivity film 12. Then, as illustrated in FIG. 8B, a pattern of the resist pattern 16 is formed over the metal-containing film 18 through the photolithography. Then, as illustrated in FIG. 9, the metal-containing film 18 in the PMOS region 2 is removed with the resist pattern 16 as a mask, and only the metal-containing film 18 remain in the NMOS region 4. Thereafter, the resist pattern 16 over the metal-containing film 18 is removed by ashing in a state where the high-permittivity film 12 in the PMOS region 2 is exposed.

In the above comparative example, it is found by studying by the inventors that the following two transistor characteristics mainly fluctuate. First, because the high-permittivity film 12 of the underlying layer is exposed, when the resist pattern 16 is removed by ashing, the high-permittivity film 12 may be nitrided or increased, or plasma damage may occur in the high-permittivity film 12. Also, second, when the resist is coated over the metal-containing film 18, carbon or nitrogen in the resist may react with La that is the work function modulating metal to generate a reactant such as La—F. The reactant interferes with peeling off of La or diffusion of La. In this way, in the comparative example in which a pattern of the layer containing La therein is formed through the photolithography, various transistor characteristics (electric characteristics) may fluctuate.

Figure 10A:
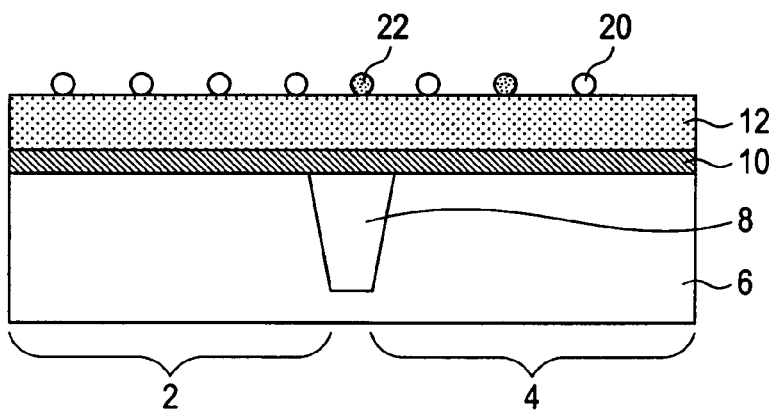
FIGS. 10A and 10B are cross-sectional views illustrating a manufacturing procedure for a semiconductor device according to the comparative example.
Figure 10B:
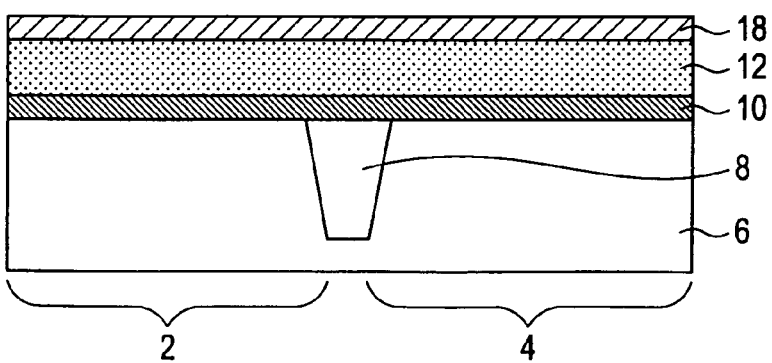

Also, in the comparative example, there is a case in which such a rework that the above process is again reworked when misalignment occurs. In this case, as illustrated in FIG. 10A, the metal-containing film 18 is first removed once. However, in this situation, a reactant 22 of the resist and La, and a residue 20 of La remain on the high-permittivity film 12. On this high-permittivity film 12 is formed the metal-containing film 18 (FIG. 10B), and the processes illustrated in FIGS. 8B and 9 are repeated. For that reason, the fluctuation of the above-mentioned two transistor characteristics may further increase.

On the contrary, in this embodiment, in order to form a pattern of the metal-containing film 118 containing La therein, the sacrifice film 114 is used without using the photolithography. For that reason, in this embodiment, the reactant of La due to the resist is not generated. Also, since the sacrifice film 114 is disposed over the high-permittivity film 112, the La residue is not generated over the high-permittivity film 112. Also, since there is no process of peeling off the resist by ashing in the state where the surface of the high-permittivity film 112 is exposed, the high-permittivity film 112 is not nitrided and increased, and no plasma damage occurs in the high-permittivity film 112. That is, in this embodiment, the variation of the transistor characteristics, which occurs in the process of the comparative example, can be suppressed. Also, since the high-permittivity film 112 is not exposed, the fluctuation of the transistor characteristic due to the rework is also suppressed.

Second Embodiment

Subsequently, a second embodiment will be described.

FIGS. 5A, 5A to 7A, 7B are cross-sectional views illustrating a manufacturing procedure of a semiconductor device according to a second embodiment.

A method of manufacturing the semiconductor device 100 according to the second embodiment is identical with that in the first embodiment except for a step of forming a sacrifice film 134. That is, a step of forming a pattern of the sacrifice film 134 in the method of manufacturing the semiconductor device 100 includes a step of forming a metal layer (the sacrifice film 134) containing at least one element selected from a group consisting of Ti, Al, a metal element of Group III, and a metal element of Group V therein, a step of forming a pattern of the sacrifice film 134, and a step of nitriding a surface layer of the sacrifice film 134.

Figure 5A:
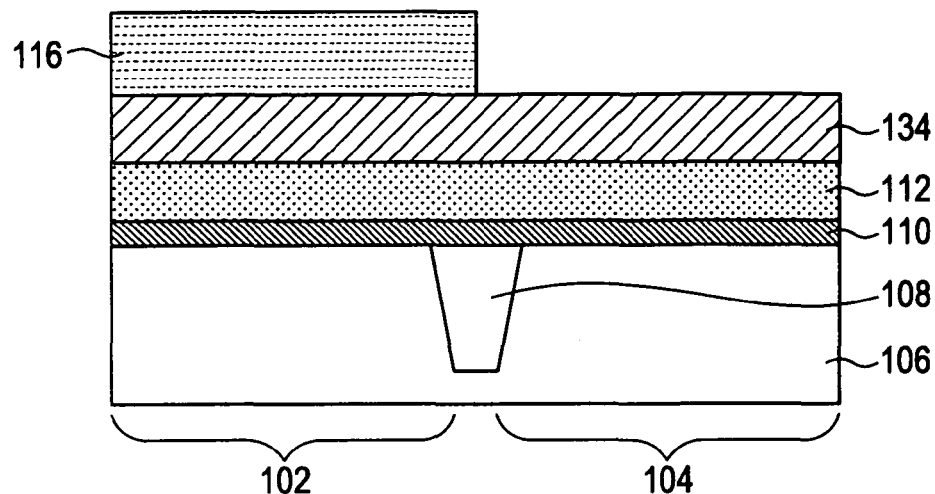
FIGS. 5A and 5B are cross-sectional views illustrating the manufacturing procedure for the semiconductor device according to the embodiment of the present invention.

First, as illustrated in FIG. 5A, as in the first embodiment, the interface oxide film 110 and the high-permittivity film 112 are laminated over the semiconductor substrate 106 in the PMOS region 102 and the NMOS region 104. Subsequently, the sacrifice film 134 is formed over the high-permittivity film 112. The sacrifice film 134 is not yet nitrided, and for example, at least one element selected from the group consisting of Ti, Al, the metal element of Group III, and the metal element of Group V can be provided as the metal layer. Subsequently, the sacrifice film 134 is patterned with the use of the resist pattern 116. In this situation, since the sacrifice film 134 is not nitrided, the patterning is facilitated.

Figure 5B:
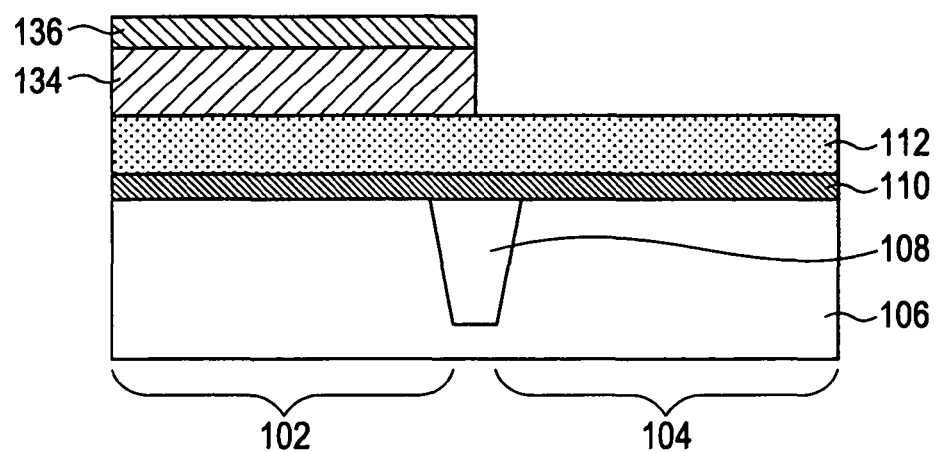

Subsequently, as illustrated in FIG. 5B, the surface layer of the patterned sacrifice film 134 is subjected to a nitriding process. As a result, a nitride layer 136 is formed over the surface layer of the sacrifice film 134.

Figure 6A:
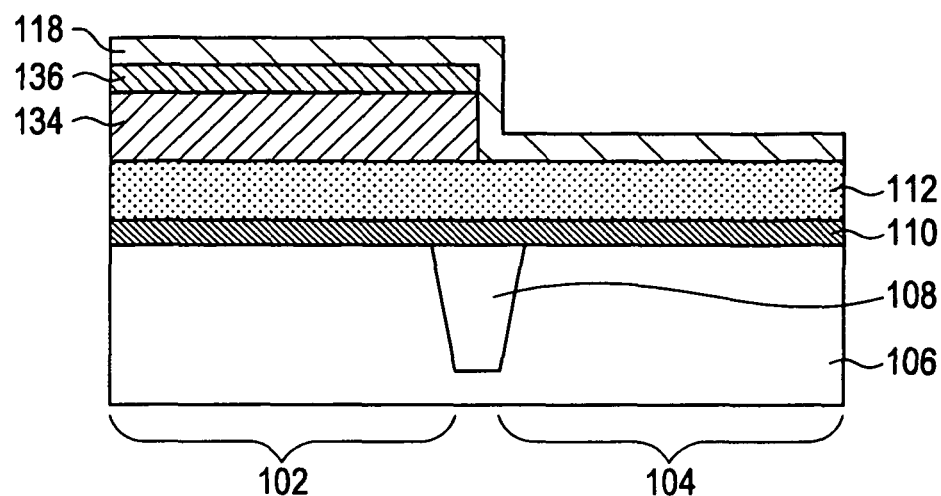
FIGS. 6A and 6B are cross-sectional views illustrating the manufacturing procedure for the semiconductor device according to the embodiment of the present invention.
Figure 6B:
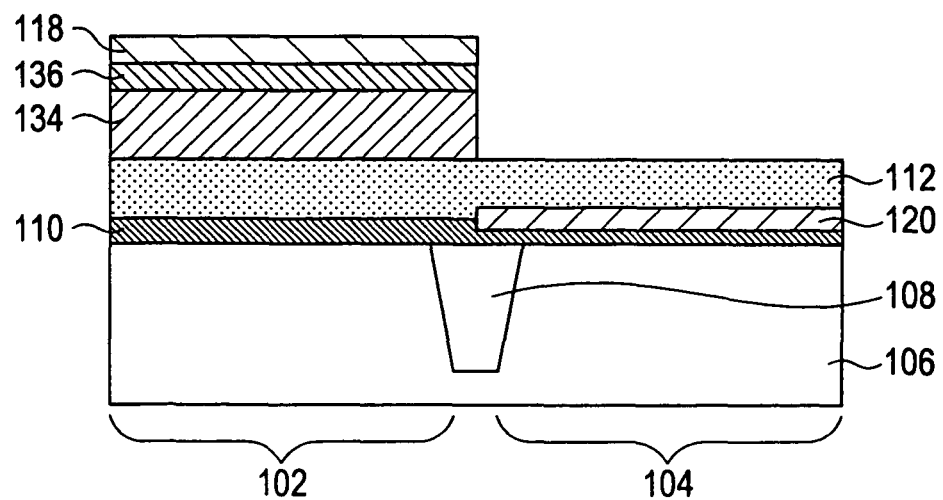
Figure 7A:
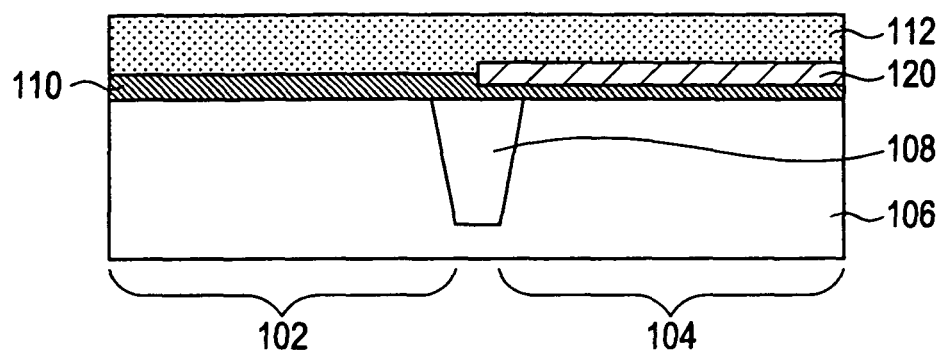
FIGS. 7A and 7B are cross-sectional views illustrating the manufacturing procedure for the semiconductor device according to the embodiment of the present invention.
Figure 7B:
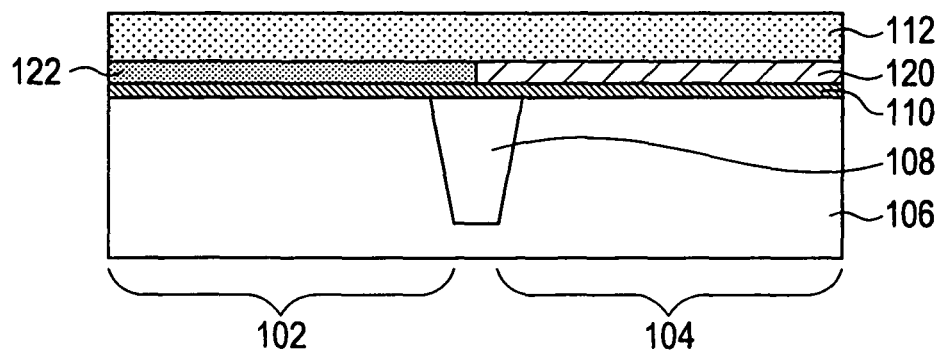

The subsequent processes are identical with those in the first embodiment. That is, the metal-containing film 118 containing the work function modulating metal element is formed over the nitride layer 136 in the PMOS region 102 and over the high-permittivity film 112 in the NMOS region 104 (FIG. 6A). Subsequently, a heat treatment is conducted, and the work function modulating metal 120 (La) is introduced into the interface between the interface oxide film 110 and the high-permittivity film 112 in the NMOS region 104 (FIG. 6B). Subsequently, the metal-containing film 118, the sacrifice film 134, and the nitride layer 136 are removed as in the first embodiment (FIG. 7A). Thereafter, the processes of FIGS. 5A to 7A are conducted in the PMOS region 102, and as illustrated in FIG. 7B, a structure is obtained in which the work function modulating metal 122 (Al) is introduced into the interface between the interface oxide film 110 and the high-permittivity film 112 in the PMOS region 102. Then, the normal process of manufacturing the semiconductor device is conducted to obtain the semiconductor device 100 illustrated in FIG. 1.

In the second embodiment, the metal film that is not nitrided is used for the sacrifice film 134. As a result, the sacrifice film 134 is easily patterned to enhance the process stability. Also, the patterned sacrifice film 134 is subjected to a nitriding process whereby the nitride layer 136 can be formed over the surface layer of the sacrifice film 134. The sacrifice film 134 can prevents La from diffusing in the high-permittivity film 112 in the PMOS region 102. Similarly, in the second embodiment, the same advantages as those in the first embodiment are obtained.

Third Embodiment

A third embodiment is identical with the first embodiment except that the step of removing the sacrifice film 114 through the lift-off method is different.

In the third embodiment, in the step illustrated in FIG. 3A, the sacrifice film 114 is removed whereby only the metal-containing film 118 in the PMOS region 102 can be removed. Through the above lift-off method, the metal-containing film 118 can be made to remain over only the high-permittivity film 112 in the NMOS region 104. Thereafter, the work function modulating metal 120 can be introduced into the interface between the interface oxide film 110 and the high-permittivity film 112 in only the PMOS region 102 by a heat treatment.

With the above processes, the third embodiment can obtain the same advantages as those in the first embodiment.

The above-mentioned embodiments and plural modified examples can be combined together unless the contents thereof conflict each other. Also, in the above-mentioned embodiments and modified examples, the structures of the respective parts have been described in detail. Those structures can be variously changed without departing from the subject matter of the present invention.

What is claimed is:

1. A method of manufacturing a semiconductor device having a p-type field effect transistor and an n-type field effect transistor, said method comprising:

forming an interface insulating layer and a high-permittivity layer on a substrate in the stated order;

forming a pattern of a sacrifice layer on the high-permittivity layer;

forming a metal-containing film containing metal elements therein on the high-permittivity layer in a first region where the sacrifice layer is formed and a second region where no sacrifice layer is formed;

introducing the metal elements into an interface between the interface insulating layer and the high-permittivity layer in the second region by conducting a heat treatment; and removing the sacrifice layer by wet etching, wherein in the removing the sacrifice layer is etched easily more than the high-permittivity layer;

wherein the step of forming the pattern of the sacrifice film includes:

forming a metal layer containing at least one element selected from a group consisting of Ti, Al, a metal element of Group III, and a metal element of Group V therein;

forming a pattern of the metal film; and nitriding a surface layer of the metal film.

* * * * *